United States Patent [19]
Good et al.

[11] Patent Number: 5,571,256
[45] Date of Patent: Nov. 5, 1996

[54] SERVER DRAWER SLIDE MOUNT APPARATUS FOR A RACK-MOUNTED COMPUTER SYSTEM

[75] Inventors: Lowell M. Good, Cypress; Paily T. Varghese, Tomball; Joseph A. Villanueva, Spring, all of Tex.

[73] Assignee: Compaq Computer Corporation, Houston, Tex.

[21] Appl. No.: 328,893

[22] Filed: Oct. 25, 1994

[51] Int. Cl.6 .................................................. A47F 7/00
[52] U.S. Cl. ........................ 211/26; 211/151; 312/223.1
[58] Field of Search ............................ 211/26, 187, 151; 312/223.1, 330.1, 265.1, 265.4

[56] References Cited

U.S. PATENT DOCUMENTS

| | | | |
|---|---|---|---|
| 2,789,024 | 4/1957 | Heisler | 312/333 |
| 2,880,379 | 3/1959 | Stoddart et al. | 317/101 |
| 4,473,262 | 9/1984 | Staye | 312/333 |
| 4,482,066 | 11/1984 | Dykstra | 211/151 |
| 4,509,810 | 4/1985 | Erlam et al. | 339/17 M |
| 4,979,909 | 12/1990 | Andrews | 211/26 |
| 5,165,770 | 11/1992 | Hahn | 211/26 |
| 5,250,752 | 10/1993 | Cutright | 312/265.4 |

*Primary Examiner*—Ramon O. Ramirez
*Assistant Examiner*—Anita M. King
*Attorney, Agent, or Firm*—Konneker & Smith

[57] ABSTRACT

In a rack-mounted computer system a server unit drawer structure is mounted between spaced pairs of front and rear corner support channel portions of the server cabinet using a pair of specially designed slide support brackets, each positioned on a different side of the drawer structure and extending completely between its associated pair of front and rear corner support channels. Front ends of the brackets have vertically spaced alignment tabs that are complementarily received in openings in side flange portions of the front corner channels and serve to precisely align the front bracket ends, and thus the front end wall of the drawer structure, with the cabinet framework in both horizontal directions. The front and rear ends of the brackets are secured to their associated support channels with threaded fasteners. The drawer is slidably mounted on the installed brackets using a conventional telescoping slide structure having a front end portions secured to opposite side walls of the drawer, and rear end portions secured to the brackets. The attachment of the rear slide structure end portions to their associated support brackets is substantially facilitated by horizontally series of nut members captively retained on the brackets. Threaded fasteners are extended through spaced series of openings in the rear slide structure end portions and threaded into the captively retained nut members on the slide support brackets.

10 Claims, 2 Drawing Sheets

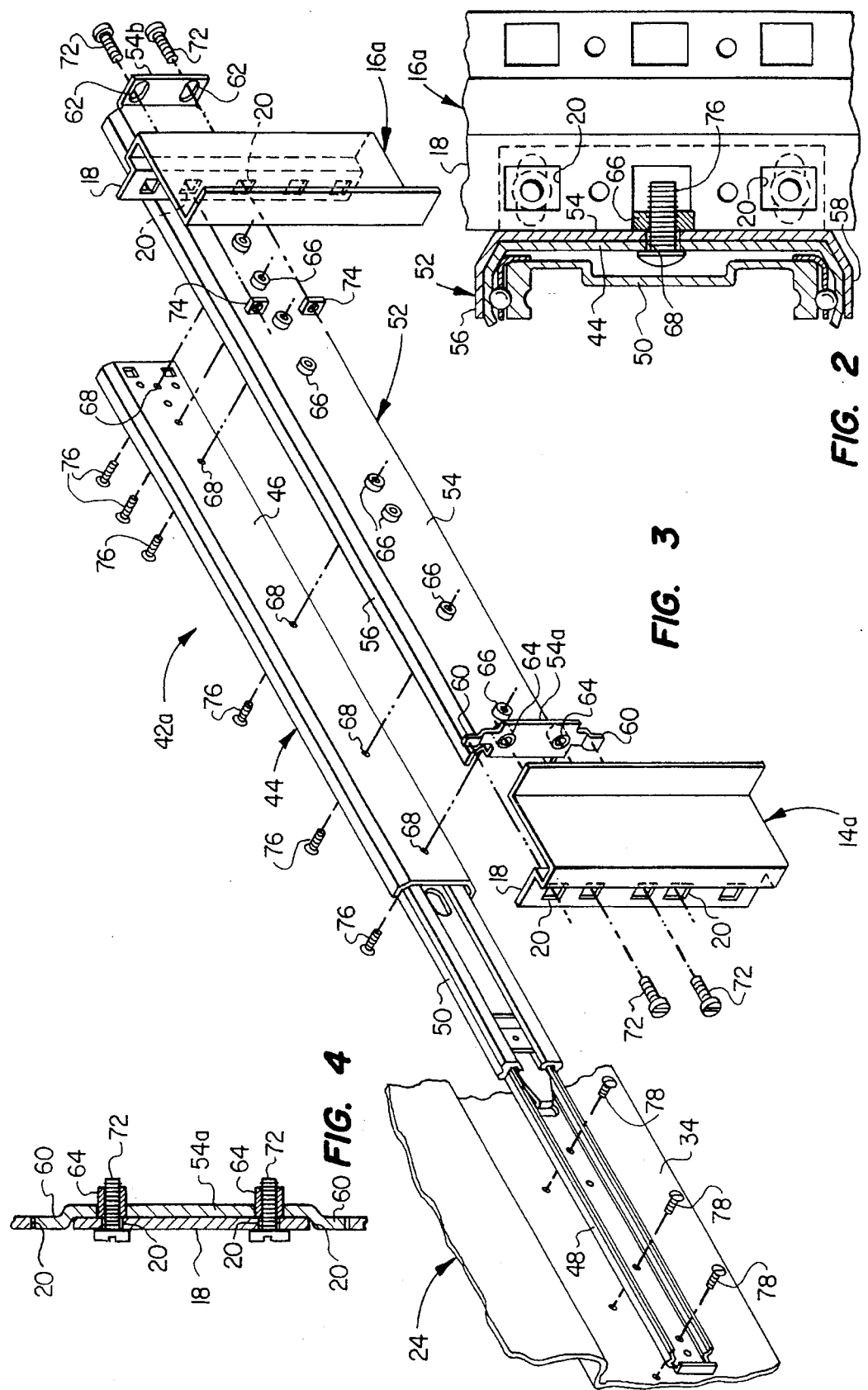

SERVER DRAWER SLIDE MOUNT APPARATUS FOR A RACK-MOUNTED COMPUTER SYSTEM

BACKGROUND OF THE INVENTION

1. Field of the Invention

The present invention generally relates to computer apparatus, and more particularly relates to apparatus for slidably mounting a server unit drawer structure to the cabinet framework of a rack mounted computer system.

2. Description of Related Art

In the interest of installation floor space economy, main portions of high capacity computer systems are often mounted in rack structures that typically comprise vertically elongated, floor mounted cabinet assemblies of standard sizes. The cabinet assembly conventionally used for this purpose typically includes a rectangular internal frame structure externally covered by removable panels and a horizontally pivotable front access door.

One of the subsystems conventionally incorporated in a rack-mounted computer system of this type is a central server which is basically a high capacity computer operatively coupled to remotely located computer work stations. To provide access to the server components they are typically mounted in a server drawer structure slidably supported in the internal frame portion of the rack cabinet for horizontal movement relative thereto between a forwardly extended component access position, and a rearwardly retracted closed operating position.

The vertically elongated cabinet frame structure is typically of an industry-standard horizontal width (along its front side), but may have varying horizontal depths. Extending vertically along each of the left and right sides of the cabinet frame structure are front and rear corner support channels. Each server drawer structure incorporated in the particular rack-mounted computer system is slidably secured on opposite sides thereof to a pair of front and rear corner support channels by a pair of longitudinally adjustable slide mount assemblies each having a two piece slide support bracket and a telescoping slide structure.

To operatively mount a server drawer on the associated rack cabinet frame, the two slide mount assemblies must first be constructed and attached to the facing pairs of front and rear corner support channels. At each side of the cabinet support structure this is accomplished by measuring the horizontal distance between the front and rear support channels, positioning the two slide support bracket sections apart a distance such that outer ends thereof will be adjacent the front and rear support channels when construction of the slide mount assembly is completed, securing an inner end portion of the telescoping slide structure to the spaced apart slide support bracket sections, with a series of screws and nuts, at locations thereon which will maintain the selected spacing therebetween, and then placing the slide support bracket sections adjacent their associated corner support channels to verify that the distance between the slide support section outer ends precisely matches the distance between the corner support channels to which they will ultimately be secured.

If the distance between the slide support bracket section outer ends is greater or less than that required, the inner end portion of the telescoping slide structure must be disconnected from one of the slide support bracket section outer ends, to permit the distance between the slide support bracket section outer ends to be adjusted, and then reconnected to the slide support section outer end. The bracket portions of the overall slide mount assembly must then again be positioned adjacent their associated corner support channels to test their separation length before they are secured to their associated corner support channels.

As can be seen, this length adjustment of the bracket portion of each slide mount assembly tends to be an iterative, rather tedious task which must often be carried out several times for each assembly before it properly fits the horizontal depth of the cabinet structure. It also typically demands a considerable amount of manual dexterity due to the separate screws and nuts which must be handled from opposite sides of the slide mount assembly to install, loosen and retighten the telescoping slide portion of the assembly to the two bracket portions thereof.

After this length adjustment is finally made to each of the two slide mount assemblies required to slidably mount a server drawer to the cabinet frame structure, the two spaced apart slide bracket sections of each assembly are secured to their associated front and rear corner support channels using threaded fasteners. The outer ends of the telescoping slide structures are then secured to the opposite side walls of their associated server drawer.

The drawer mounting problems typically do not, however, end here. After the drawer is secured to the outer ends of the telescoping slide structures its front end wall is often horizontally and/or vertically misaligned with the front end walls of the front end walls of server drawers directly above and below it due to horizontal and/or vertical misalignments of the front slide bracket sections relative to the front corner support channels of the rack cabinet. When this occurs, the server drawer must be removed from the telescoping slide structures on its opposite sides, to permit the front slide support bracket sections to be reoriented on their associated corner support channels, and then reconnected to the outer ends of the telescoping slide structures. This process must often be repeated several times for each drawer to provide the requisite horizontal and vertical alignment among the various vertically stacked server drawers incorporated in the overall rack-mounted computer system.

As can readily be seen from the foregoing, it would be highly desirable to provide improved server drawer slide mount apparatus that eliminates or at least substantially minimizes the above-mentioned problems, limitations and disadvantages commonly associated with conventional slide mount apparatus as generally described above. It is accordingly an object of the present invention to provide such improved slide mount apparatus.

SUMMARY OF THE INVENTION

In carrying out principles of the present invention, in accordance with a preferred embodiment thereof, a rack-mounted computer system is provided and includes a vertically elongated, generally rectangularly cross-sectioned cabinet having an internal frame structure including two spaced pairs of vertically extending front and rear corner support channels. Each corner support channel has a laterally inwardly projecting side flange with a vertically spaced series of openings extending therethrough. The rack-mounted computer system also includes a server unit including a drawer structure into which selected computer components may be operatively placed, the drawer structure having a front end wall from which a pair of opposite vertical side walls rearwardly extend.

Mounting means are provided for supporting the drawer structure on the internal cabinet frame structure, between the spaced pairs of vertically extending front and rear corner support channels, for horizontal forward and rearward movement relative thereto between open and closed positions.

According to a key aspect of the present invention, the mounting means, on each side of the drawer structure, include a specially designed elongated one-piece slide support bracket longitudinally extending parallel to one of the drawer structure side walls and having a front end portion engaging the side flange of one of the front corner support channels, and a rear end portion engaging the side flange of one of the rear corner support channels.

Alignment means are carried on the front end portion of the slide support bracket and are complementarily received in a vertically spaced first pair of the openings in the side flange of the front corner support channel and function to horizontally and vertically align the front end portion of the slide support bracket with the front corner support channel. Representatively, the alignment means comprise a vertically spaced pair of rectangular alignment tabs, and the openings in the side flange of the front corner support channel are also of a rectangular configuration.

First attachment means are provided for removably securing the front end portion of the slide support bracket to the side flange of the front corner support channel, and second attachment means are provided for removably securing the rear end portion of the slide support bracket to the side flange of the rear corner support channel.

According to one aspect of the present invention, the first attachment means include a vertically spaced pair of nut members captively retained on the front end portion of the slide support bracket and aligned with a second vertically spaced pair of openings in the side flange of the front corner support channel. Threaded fasteners are extended through this second pair of side flange openings and are threaded into the captively retained nut members.

According to another aspect of the present invention, the second attachment means include a vertically spaced pair of openings formed in the rear end portion of the slide support bracket and aligned with a vertically spaced pair of openings in the side flange of the rear corner support channel. The rear slide support bracket end portion is retained on the side channel by threaded fasteners extended through the side flange and rear end portions and threaded into retaining nuts.

The rack-mounted computer apparatus further comprises a telescoping slide structure having an inner end portion removably secured to the slide support bracket, and an outer end removably secured to one of the side walls of the drawer structure. According to another aspect of the present invention, the inner slide structure end portion is secured to the slide support bracket by means of a horizontally spaced series of threaded fastening members extended through openings in the inner slide structure end portion and threaded into a spaced series nut members captively retained on and extending along the length of the slide support bracket between its front and rear end portions.

The complementary interfit between the alignment tabs and the openings in the side flange of the front corner support flange automatically aligns the front end of the slide support bracket with the front corner support channel in both horizontal and vertical directions, thereby assuring a precise horizontal and vertical positioning of the front end wall of the server drawer structure with the cabinet frame structure. The captively retained nut members on the slide support bracket substantially simplify its attachment to the telescoping slide structure and the front corner support channel, and the one-piece configuration of the slide support bracket advantageously eliminates the laborious trial and error attachment methods associated with conventional two-piece slide support brackets.

BRIEF DESCRIPTION OF THE DRAWINGS

FIG. 2 is an enlarged scale cross-sectional view through a portion of the slide mount structure taken along line 2—2 of FIG. 1;

FIG. 3 is an enlarged scale partially exploded perspective view of a side portion of the overall slide mount structure illustrating its connection to the cabinet frame and to the server drawer; and FIG. 4 is an enlarged scale partial cross-sectional view through the cabinet frame and illustrates the connection thereto of a support bracket portion of the slide mount structure.

DETAILED DESCRIPTION

Figure 1:
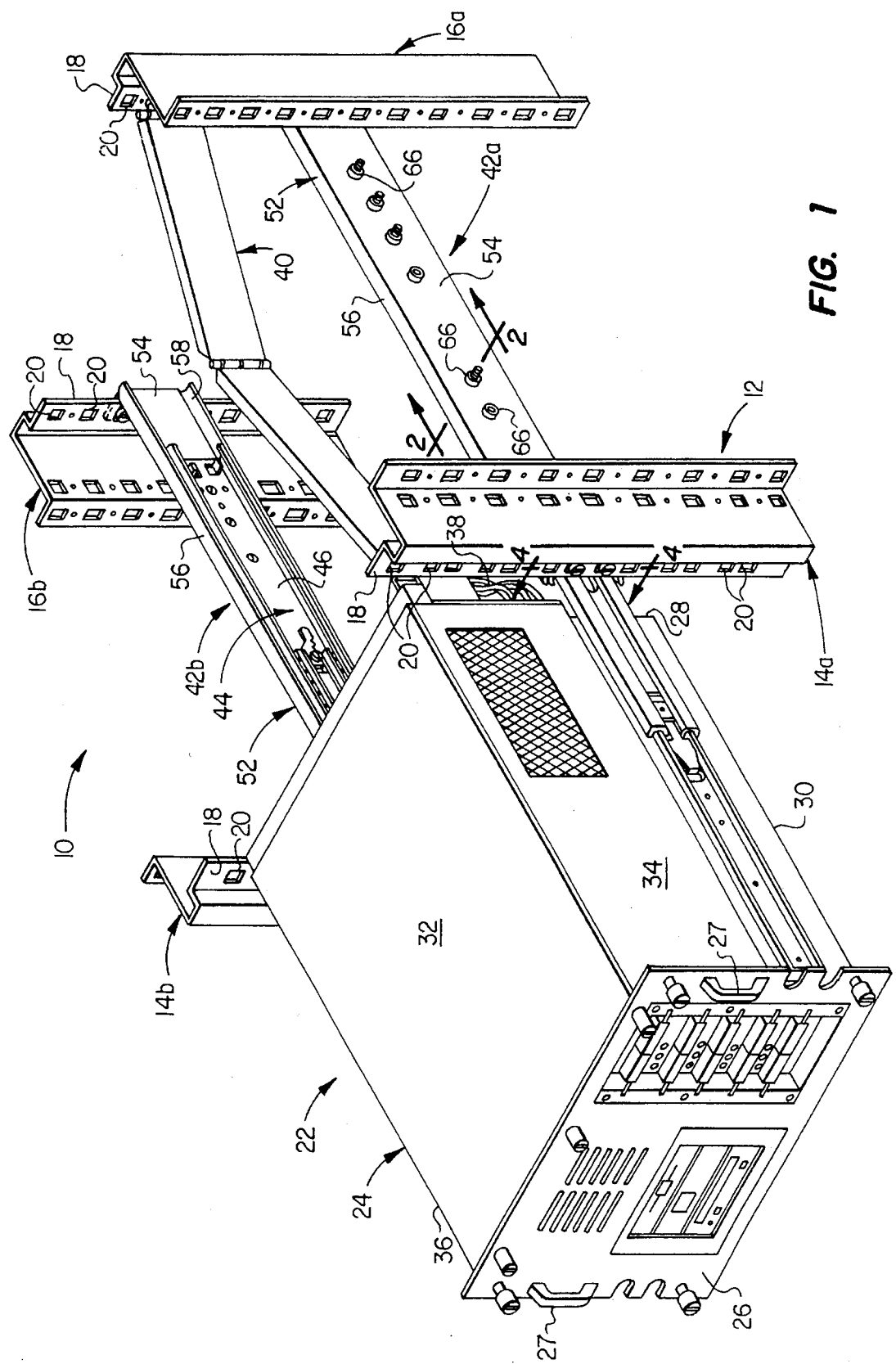
FIG. 1 is a perspective view of a vertical portion of a cabinet frame section of a rack-mounted computer system and illustrates a specially designed slide mount structure embodying principles of the present invention and used to support a server drawer on the cabinet frame for horizontal movement relative thereto.

Perspectively illustrated in FIG. 1 is a vertical portion of a rack-mounted computer system 10 that includes a vertically elongated, floor mounted cabinet structure 12 which is of a conventional construction and has, along its vertical length, a generally rectangular cross-section. An interior frame structure of the cabinet 12 includes a pair of vertically extending front and rear support channels 14a,16a on the right side of the cabinet, and a pair of vertically extending front and rear support channels 14b,16b on the left side of the cabinet.

The four channels 14a,14b,16a,16b are tied to one another by horizontal cross brace members (not shown) and have inwardly projecting side flange portions 18. For purposes later described herein, vertically spaced series of rectangular openings 20 are formed in the side flange portions 18. The front access door normally extending between the front support channels 14a,14b and the side and top cover panels secured to the remaining periphery of the cabinet frame structure have been removed from the support channels in FIG. 1 for illustrative purposes.

A server unit 22 includes a rectangular server drawer structure 24 slidably carried on the cabinet frame structure for horizontal movement relative thereto between a forwardly extended open position shown in FIG. 1, and a rearwardly retracted closed position in which the server drawer structure 24 is disposed within the interior of the cabinet frame structure. The server drawer structure 24 includes a front end wall 26 having a pair of pull handles 27 thereon, a rear end 28, a bottom wall 30, a removable top cover panel 32, a right side wall 34, and a left side wall 36.

Various computer operating components (not shown) are housed within the server drawer structure 24 and are coupled to various electrical cables 38 that exit the rear end 28 of the server drawer structure 24. The cable portions exterior to the server drawer structure 24 are supported in a conventional articulated cable arm structure 40 connected at its opposite ends to the rear end 28 of the server drawer and the rear corner support channel 16a.

As illustrated in FIG. 1, the server drawer structure 24 is slidably mounted on the cabinet frame structure by two specially designed slide mount assemblies 42a,42b that embody principles of the present invention and are connected as subsequently described herein to the cabinet frame structure and to the opposite side walls 34 and 36 of the server structure 24. The two slide mount assemblies 42a,42b are identical to one another. Accordingly, only the slide mount assembly 42a, on the right side of the server drawer structure 24, will be described.

Referring now to FIGS. 1–4, the slide mount assembly 42a includes a conventional telescoping slide structure 44 having an inner end portion 46, an outer end portion 48, and a longitudinally intermediate portion 50, and a specially configured one piece slide support bracket 52 embodying principles of the present invention.

Slide support bracket 52 has an elongated body portion that is sized to longitudinally extend between the side flange portions 18 of the front and rear corner support channels 14a,16a on the right side of the server drawer structure 24. The body portion of the slide support bracket 52 is defined along its length by a vertical base wall 54, and a pair of flange portions 56 and 58 projecting horizontally inwardly from the top and bottom side edges of the base wall 54.

A front end section 54a of the base wall 54 is bent transversely thereto, in a direction opposite to that of the flanges 56 and 58, and has narrowed, forwardly offset top and bottom end tabs 60 each having a rectangular configuration and being sized to be complementarily received in one of the rectangular openings 20 formed in the vertical side flange portion 18 of the front corner support channel 14a.

A rear end section 54b of the base wall 54 is also bent transversely thereto, in a direction opposite to that of the flanges 56 and 58, and has a vertically spaced pair of horizontally elongated openings 62 formed therein. For purposes later described herein, a vertically spaced pair of nut structures 64 are captively retained on the front end section 54a of the base wall 54, and a horizontally spaced series of nut structures 66 are captively retained on the base wall 54 along its length, various ones of the nut structures 66 being alignable with spaced openings 68 formed through the inner end portion 46 of the telescoping slide structure 44 along its length (see FIG. 3).

To slidably mount the server drawer structure 24 on the cabinet support frame structure, at each of the right and left sides of the intended drawer mounting location a one piece slide support bracket 52 is positioned in a manner such that its front end alignment tabs 60 are forwardly and complementarily received in a vertically spaced pair of rectangular openings 20 in one of the flanges 18 of a front corner support channel 14, and the front end nut structures 64 are aligned with another pair of the rectangular openings 20 (see FIG. 4).

The front end section 54a of the bracket 52 is then removably anchored to its associated support channel flange 14 by inserting a pair of screws 72 (see FIGS. 3 and 4) rearwardly through a pair of flange openings 20 between the two flange openings 20 that complementarily receive the alignment tabs 60, and then threading the mounting screws 72 into the nuts 64. At each slide support bracket 52, the placement of its front end alignment tabs 60 into the associated pair of support channel flange openings 20 positions the rear end section 54b of the slide support bracket forwardly against the channel 18 of its associated rear corner support channel 16. Each end section 54b is then removably anchored to its associated channel 18 by means of screws 72 (see FIG. 3) extended forwardly through the end section openings 62 and a vertically spaced pair of flange openings 20, and threaded into rectangular nuts 74.

Next, as illustrated in FIGS. 2 and 3, the inner end portions 46 of the telescoping slide structures 44 are placed against the inner sides of the bracket side walls 54, in a manner aligning slide structure openings 68 with the nut structures 66 captively retained on the bracket base walls 54, and mounting screws 76 are extended through the slide structure openings 68 and threaded into the captively retained nuts 66 on the slide bracket base wall 54. Finally, the outer end portions 48 of the telescoping slide structures 44 are anchored to the opposite side walls 34,36 of the server drawer structure 24 using screws.

Compared to the conventional server drawer mounting method of using two separate, horizontally spaced slide mounting bracket sections on each side of the server drawer, the slide mount assemblies 42a,42b of the present invention provide several distinct advantages. For example, the attachment of the slide support brackets 52 to the cabinet frame structure is not a laborious, time-consuming iterative process since each of the slide support brackets 52 is of a single, unitary construction and is longitudinally sized to precisely extend between the pair of support channels 14,16 on either side of the server drawer structure. All that is necessary to mount each slide support bracket 52 is to position it between its associated pair of corner support channels 14,16 as described above and screw it into place on the cabinet support frame structure.

Additionally, the unique cooperation between the front end tabs 60 on each of the slide support brackets 52, and the channel openings 20 that complementarily receive the tabs 60, precisely aligns the front ends of the installed slide support brackets 52 with one another in both horizontal and vertical directions. Accordingly, the front end walls 26 of each server drawer structure 24 installed using the slide mount assemblies 42 of the present invention are similarly aligned with one another, both horizontally and vertically, and there is no need to subsequently adjust the relative horizontal and vertical positions of the drawer structures to correct for relative misalignments therebetween.

Due to the use of the captively retained nuts 66 on the slide support brackets 52, the attachment of the inner end portions 46 of the telescoping slide structures 44 thereto is substantially simplified since only the screws 76 need to be manipulated when securing the slide structure inner end portions 46 to the bracket base walls 54 within the interior of the cabinet framework structure. Additionally, the outwardly bent rear end portions 54b of the slide support brackets 52 considerably simplify the connection of the slide mount assemblies 42a,42b to the rear side of the cabinet framework structure.

The foregoing detailed description is to be clearly understood as being given by way of illustration and example only, the spirit and scope of the present invention being limited solely by the appended claims.

What is claimed is:

1. Rack-mounted computer apparatus comprising:

a generally rectangularly cross-sectioned cabinet frame structure including two spaced pairs of vertically extending front and rear corner support channels, each corner support channel having a laterally inwardly projecting side flange with a vertically spaced series of openings formed therethrough;

a server unit including a drawer structure into which selected computer components may be operatively placed, said drawer structure having a front end wall from which a pair of opposite vertical side walls rearwardly extend; and mounting means for supporting said drawer structure on said cabinet frame structure, between said spaced pairs of vertically extending front and rear corner support channels, for horizontal forward and rearward movement relative thereto between open and closed positions, said mounting means, on each side of said drawer structure, including:

a horizontally elongated one-piece slide support bracket longitudinally extending parallel to one of said drawer structure side walls and having a front end portion engaging the side flange of one of said front corner support channels, and a rear end portion engaging the side flange of one of said rear corner support channels, said slide support bracket having a horizontally elongated base wall, and said front end portion of said slide support bracket being transverse to said base wall and having upper and lower ends, alignment means, carried on said front end portion of the slide support bracket and complementarily received in a vertically spaced first pair of the openings in the side flange of the front corner support channel, for horizontally and vertically aligning the front end portion of the slide support bracket with the front corner support channel, said alignment means including alignment tabs formed on said upper and lower ends and forwardly and complementarily received in said vertically spaced first pair of openings in the side flange of the front corner support channel, first attachment means for removably securing said front end portion of the slide support bracket to the side flange of the front corner support channel, said front end portion of said slide support bracket forwardly abutting the side flange of the front corner support channel, said first attachment means including a pair of nut members captively retained on said front end portion of said slide support bracket and aligned with a vertically spaced second pair of said openings in the side flange of the front corner support channel, and a pair of fastening members extending rearwardly through said vertically spaced second pair of openings in the side flange of the front corner support channel and threaded into said pair of captively retained nut members, second attachment means for removably securing said rear end portion of the slide support bracket to the side flange of the rear corner support channel, and a telescoping slide structure having an inner end portion removably secured to said slide support bracket, and an outer end removably secured to one of said side walls of said drawer structure.

2. The rack-mounted computer apparatus of claim 1 wherein:

the alignment tabs, and the vertically spaced first pair of openings in the side flange of the front corner support channel, have rectangular configurations.

3. The rack-mounted computer apparatus of claim 1 wherein:

said slide support bracket includes a longitudinally spaced series of nuts captively retained on said elongated base wall, said inner end portion of said telescoping slide structure has a spaced series of openings therein which are aligned with said longitudinally spaced series of captively retained nuts, and said inner end portion of said telescoping slide structure is removably secured to said slide support bracket by means of a series of fastening members extending through said openings in said inner end portion of said telescoping slide structure and threaded into said series of captively retained nuts.

4. The rack-mounted computer apparatus of claim 1 wherein:

said rear end portion of said slide support bracket is transverse to said base wall and has a vertically spaced pair of openings disposed therein and aligned with a vertically spaced pair of said openings in the side flange of said rear corner support channel, and said second attachment means include a pair of threaded fasteners extending through said openings in said rear end portion of said slide support bracket and said vertically spaced pair of openings in the side flange of said rear corner support channel and threaded into a pair of nut members.

5. The rack-mounted computer apparatus of claim 4 wherein:

said rear end portion of said slide support bracket forwardly abuts the side flange of said rear corner support channel.

6. A slide support bracket for horizontally mounting an inner end portion of a telescoping slide structure in a rack-mounted computer system cabinet frame structure having a pair of front and rear vertically extending corner support channels each having a laterally projecting side flange with a vertically spaced series of openings therein, the telescoping slide structure having an outer end portion securable to a side wall of a server drawer and a spaced series of openings formed along the length of said inner end portion, said slide support bracket comprising:

a horizontally positionable elongated base wall having transversely bent front and rear end sections respectively positionable against and securable to the side flanges of the front and rear corner support channels;

alignment means, formed on said front end section and complementarily receivable in a vertically spaced pair of the openings in the side flange of the front corner support channel, for precisely aligning said front end section, both horizontally and vertically, with the front corner support channel;

a series of nut means, spaced apart along the length of and captively retained on said slide bracket base wall, into which a series of threaded fastening members extended through said openings in said inner end portion of the telescoping slide structure may be threadingly secured to operatively mount it on said base wall of said slide support bracket; and nut means, captively retained on said front end section of said base wall and alignable with a plurality of openings in the side flange of the front corner support channel, for receiving threaded fastening members extended through said plurality of openings to secure said front end section to the side flange of the front corner support channel.

7. The slide support bracket of claim 6 wherein:

said rear end section has a vertically spaced pair of openings disposed therein and alignable with a vertically spaced pair of said openings in the side flange of said rear corner support channel.

8. Rack mounted computer apparatus comprising:

a generally rectangularly cross-sectioned cabinet frame structure including two spaced pairs of vertically extending front and rear corner support channels, each corner support channel having a laterally inwardly projecting side flange with a vertically spaced series of openings formed therethrough;

a server unit including a drawer structure into which selected computer components may be operatively placed, said drawer structure having a front end wall from which a pair of opposite vertical side walls rearwardly extend; and mounting means for supporting said drawer structure on said cabinet frame structure, between said spaced pairs of vertically extending front and rear corner support channels, for horizontal forward and rearward movement relative thereto between open and closed positions, said mounting means, on each side of said drawer structure, including:

a slide support bracket having a horizontally elongated base wall having a transversely bent front end section engaging the side flange of one of the front corner support channels, and a transversely bent rear end section engaging the side flange of one of the rear corner support channels, said front end section having upper and lower alignment tabs thereon which are complementarily received in a first vertically spaced pair of the openings in the side flange of the front corner support channel and function to align said front end section with the front corner support channel in both horizontal and vertical directions, first attachment means for removably securing said front end sections of said base wall to the side flange of the front corner support channel, said first attachment means including a vertically spaced pair of nut members captively retained on said front end section of said base wall and aligned with a second vertically spaced pair of the openings in the side flange of the front corner support channel, and a pair of fastening members extending through said second vertically spaced pair of the openings in the side flange of the front corner support channel and threaded into said captively retained nut members on said front end section on said base wall, second attachment means for removably securing said rear end section of said base wall to the side flange of the rear corner support channel, a telescoping slide structure having an outer end portion secured to one of said side walls of said drawer structure, and an inner end portion positioned against said base wall in a parallel relationship therewith and having a horizontally spaced series of openings therein, and third attachment means for removably securing said inner end portion of said telescoping slide structure to said base wall, said third attachment means including a horizontally spaced series of nut members captively retained on said base wall and aligned with said openings in said inner end portion of said telescoping slide structure, and a series of threaded fasteners extending through said openings in said inner end portion of said telescoping slide structure and threaded into said captively retained nut members on said base wall.

9. The rack-mounted computer apparatus of claim 8 wherein:

said alignment tabs and said vertically spaced pair of openings in the side flange of the front corner support channel have rectangular configurations.

10. The rack-mounted computer apparatus of claim 8 wherein said second attachment means include:

a vertically spaced pair of openings formed in said rear end section of said base wall and aligned with a vertically spaced pair of the openings in the side flange of the rear corner support channel, a second pair of threaded fastening members extending through said pair of openings in said rear end section of said base wall and through said vertically spaced pair of openings in the side flange of the rear corner support channel, and a pair of retaining nuts threaded onto end portions of said second pair of threaded fastening members.

* * * * *